United States Patent [19]
Cote et al.

[11] Patent Number: 5,855,962
[45] Date of Patent: Jan. 5, 1999

[54] FLOWABLE SPIN-ON INSULATOR

[75] Inventors: Donna Rizzone Cote, Paughquag, N.Y.; Son Van Nguyen, San Jose, Calif.

[73] Assignee: International Business Machines Corporation, Armonk, N.Y.

[21] Appl. No.: 780,373

[22] Filed: Jan. 9, 1997

[51] Int. Cl.$^6$ ........................................................ B05D 3/02
[52] U.S. Cl. ..................... 427/376.2; 427/387; 427/58; 438/562; 438/918
[58] Field of Search .............................. 427/58, 96, 387, 427/377, 376.3, 376.2, 228; 438/562, 918 301

[56] References Cited

U.S. PATENT DOCUMENTS

| | | | |
|---|---|---|---|
| H1309 | 5/1994 | Allen et al. | 428/224 |
| 4,455,384 | 6/1984 | Day et al. | 501/15 |
| 4,973,526 | 11/1990 | Haluska | 428/697 |
| 5,085,893 | 2/1992 | Weiss et al. | 427/387 |
| 5,436,084 | 7/1995 | Haluska et al. | 428/688 |
| 5,496,776 | 3/1996 | Chien et al. | 437/231 |
| 5,530,293 | 6/1996 | Cohen et al. | 257/752 |
| 5,635,240 | 6/1997 | Haluska et al. | 427/377 |

OTHER PUBLICATIONS

Allock et al, Synthesis and Structure of Borazinyl–Substituted Small–Molecule and High Polymeric Phosphazene: Ceramic Precursors, American Ceramic Society, pp. 296–307, 1992.

P.C. Li and L. C. Hsia, CVD Growth and Properties of Phoslon Dielectric Films, J. Electrochem. Soc: Solid–State Science and Technology Feb. 1986 pp. 366–372.

D. J. Perettie, T. A. Morgan, K. K. Kar, G. E. Potter, G. A. Meyers, The Dow Chemical Company, J. Chao, M. Russak, Y. C. Lee, HMT Technology Corporation, X–1P: An advanced X–Series Lubricant, Idema Tri222222bology Symposium May 1996.

P. Powell, P. L. Timms, The Chemistry of Non–Metals, pp. 244–271 no date available.

M. F. Welker, H. R. Allcock, G. L. Grune, R. T. Chern and V. T. Stannett, Radiation–Induced Modifications of Allylamino–Substituted Polyphosphazens, Chapter in Polymers for Microelectronics, no month available 1994 pp. 291–303.

Harry R. Allcock, Mark F. Welker, Masood Parvez, Synthesis and Structure of Borazinyl–Substituted Small–Molecule and High Polymeric Phosphazenes: Ceramic Precursors, The American Chemical Society, no month available 1992, pp. 296–307.

H. R. Allcock, Inorganic–Organic Polymers, Advanced Materials, no month available vol. 6, No. 2 pp. 106–115.

S. Veprek and Z. Iqbal, J. Brunner and M. Scharli, Preparation and Properties of Amorphous phosphorus Nitride Prepared in a Low–Pressure Plasma, Philosophical Magazine B, no month available 1981, vol. 43, No. 3 527–547.

*Primary Examiner*—Brian K. Talbot
*Attorney, Agent, or Firm*—Kris V. Srikrishnan

[57] ABSTRACT

A spin on insulating coating with ionic barrier properties is formed on a substrate, by mixing a P or B containing material such as phosphazene or borazine with a solution of silsesquioxane, spin coating on a substrate to form a film of pre-determined thickness. The coated film is cured in a step wise manner to drive out the solvents and most of the H and OH groups, with the resulting film having a composition SiONX, where X can be B, P, F and mixtures thereof. The amount of P, B or other elements are predetermined by calculating the solids in the silsesquioxane and adding suitable amount of borazine or phosphazene. The coated and cured film fills and planarizes any topography on the substrate created by etching trenches, forming gate stacks or metal lines. In one of the variation, the substrate has a layer of insulating material disposed thereon prior to the application of the spin-on insulator.

13 Claims, 5 Drawing Sheets

FLOWABLE SPIN-ON INSULATOR

FIELD OF INVENTION

The present invention relates generally to semiconductor manufacturing, and in particular to an improved insulator and process for filling gaps between features and planarizing the topography.

BACKGROUND OF THE INVENTION

Semiconductor devices and interconnections continue to shrink in feature size, leading to many unique problem. On one hand, topography is created as a result of device fabrication such as recessed oxide isolation, formation of gate electrode and sequential process of depositing and etching layers to form different regions, anneals and implants. In the current state of the art CMOS devices, the gate electrode can be 3–5 KA thick, has a nominal channel length of less than 2500 A and source/drain regions of comparable minimum widths. FIG. 1 is a simplified view of a prior art field effect transistor device.

A silicon substrate 100, has oxide isolation trenches 110 formed, the trenches 110 is etched and filled with the insulator. This provides a planar substrate to start forming the devices. The gate stack consists of a gate insulator 130 and a gate electrode 140 which is typically polysilicon with a cladding of a silicide for lowering the sheet resistivity. The gate electrode needs to be insulated from the electrode contacting the source/drain regions, which involves formation of sidewall insulators 135 (spacers) which increases the aspect ratio of the gap 180 between two closely spaced gate stacks. Responsive to this miniaturization and high aspect ratio of features and resulting gaps 170, 180 gap-fill insulating materials, vertical interconnects (studs S1) and planarization of insulator 150, 160 at each level are used. A first requirement of the insulator/process is its ability to fill narrow spaces and high aspect ratio grooves without voids.

In a contact stud process, vertical openings are etched to diffusion and gate electrode surfaces at different heights. In order to satisfactorily etch holes of different depths, while minimizing damage to underlying gate electrode or diffusions, the contact insulator typically consists of two layers, a bottom slow etching layer and a top faster etching layer. In a typical process, the bottom layer is conformally deposited and is kept to a small thickness and is usually a plasma deposited silicon dioxide or silicon nitride. Therefore a faster etching top layer compared to slower etching bottom PECVD silicon dioxide layer or silicon nitride layer is highly desirable.

Another desirable requirement for insulators adjacent to devices is that they be effective barrier to alkali ions and preferably to moisture. Two kinds of materials are effective for this. One kind form good diffusion barriers to alkali ions or water such as silicon nitride. The other material reacts with alkali ions and ties it up as a compound. An example of the latter is P doped silicon dioxide, which for example, reacts with free Na ion and forms sodium phosposilicate. SiN is used as a thinner layer because of its higher film stress and its high dielectric constant. However, P doped $SiO_2$, usually as PSG or BPSG, is used in thicker layers. P doped oxides are increasingly preferred for contact insulation applications for their gettering effectiveness and their faster etch rates and polish rates compared to undoped silicon dioxide or silicon nitride. However, these properties of P doped oxides are influenced by deposition processes, amount of P and sometimes how phosphorus resides in the structure. Further, the amount of P that can be incorporated is limited because of the deposition process limitations or the concern that the resulting film can be hygrospic and be chemically attacked easily. Boron is sometimes added to $SiO_2$ in addition to P to reduce the glass reflow temperature and to modify the film's mechanical stress.

Flowable gap-fill materials have been available and are known by the general name spin on glass (SOG). The SOG materials tend to crack on curing and can not be used except as thin layers. A new class of materials called FOx for flowable oxide, based on hydrogen silsesquioxane appears to have good fill properties, but is not effective as ionic barrier. U.S. Pat. No. 5,085,893 teaches heating the silsesquioxane layer in oxygen to form a resulting silicon dioxide layer which is ceramic like. U.S. Pat. No. 5,530,293 teaches the use of carbon free silsesquioxane for forming trench isolation fills, but recommend use of curing in a hydrogen ambient. The resulting films from both the above teachings are silicon dioxide films that do not provide a barrier against sodium or alkaline impurities, desired for insulation applications adjacent to the silicon device.

Chien et al. (U.S. Pat. No. 5,496,776) describes an ion implantation process, by which any of the following species, Si, Ar, P, B, O, N or F implanted into a spin on glass layer to reduce susceptibility for moisture absorption and outgassing from the spin-on-glass layer. By implanting P into the spin-on-glass, one would expect improvement in the alkali ion barrierproperties of the spin-on-glass or FOx, but implanting is expensive and can not be done selectively. U.S. Pat. No. 4,455,384 issued to the United States of America, Department of Energy, discloses that chemically durability of alkali phosphate glasses is improved by incorporation of up to 23 weight percent of nitrogen. The patent claimed that the addition of nitrogen to phosphate glasses create a more highly cross-linked $(PO_4)_n$ which reduced the TCE and increased the softening point. U.S. Pat. No. 4,455,384 is not directly relevant to the present invention as the glasses used in this patent have very low $SiO_2$ content and is primarily made of $P_2O_5$, but points to the benefit of adding nitrogen to high phosphate glass. All of these above materials and processes fail to meet one or more of the requirements discussed earlier.

Therefore, there is still a need for an insulator and process that can fill high aspect ratio grooves, form good barriers to alkali ions and finally allow for having differential etch and polish rates with other insulators.

SUMMARY OF THE INVENTION

A spin on insulating coating with ionic barrier properties is formed on a substrate, by mixing a P or B containing material such as phosphazene or borazine with a solution of silsesquioxane, spin coating on a substrate to form a film of pre-determined thickness. The coated film is cured in a step wise manner to drive out the solvents and most of the H and OH groups, with the resulting film having a composition SiONX, where X can be B, P, F and mixtures thereof. The amount of P, B or other elements are predetermined by calculating the solids in the silsesquioxane and adding suitable amount of borazine or phosphazene. The coated and cured film fills and planarizes any topography on the substrate created by etching trenches, forming gate stacks or metal lines. In one of the variation, the substrate has a layer of insulating material disposed thereon prior to the application of the spin-on insulator.

OBJECTS OF THE INVENTION

An object of the present invention is to develop an insulator that has high gap-fill properties.

Another object of the present invention is to develop an insulator that etches at a higher rate compared to undoped silicon dioxide or silicon nitride.

A further object of the invention is to dope such as insulator with at least 2–10 wt % of Phosphorus as an effective ionic barrier.

An yet further object of the invention is to develop an insulator of above characteristics that is compatible with the thermal and adhesion requirements of the silicon passivation and easily integrated in current manufacturing.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

The present invention is focussed on modifying the spin-on flowable oxide to achieve the desirable properties outlined earlier, namely addition of desired amount of P, B or F, maintaining gap-fill and planarization properties, and improve adhesion to underlying substrates. The flowable oxide layers of the present invention can be obtained from many starting materials. A preferred family of precursors used in the present invention is hydrogen silsesquioxanes, which are carbon free $SiO_2$ precursors and are known as FOx, or flowable oxide in the literature. Examples of such are disclosed in U.S. Pat. No. 5,085,893, which is incorporated herein by reference. These are represented by the formula

Figure 2:
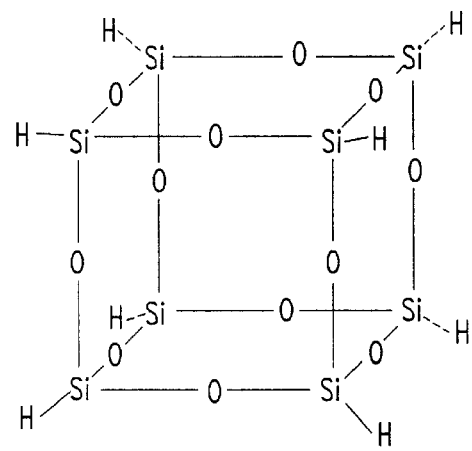
FIG. 2 shows a prior art 3-D molecular structure of a spin on flowable oxide material (glassy)

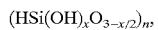

where n is a large integer representing short range groupings, x is between 0 and 2 and preferably less than 1. FIG. 2 illustrates the molecular structure of the FOx materials. The silsesquioxane is preferably employed as a 1–20 weight percent solution preferably in an organic polar solvent, such as ethyl acetate, methyl isobutyl ketone, t-butyl acetate, diethyl ether or mixtures thereof. The FOx materials are commercially available from Dow Corning Corporation, and available in a range of weight percent solutions.

Li and Hsia (Journal of ECS, February 1986, p 366–372) reported on a new family of materials, they called "phoslons" prepared by CVD or PECVD techniques, consisting of P,O and N. These dielectrics were found to be very stable, inert to chemicals and have a dielectric breakdown strength in excess of 10*7 V/cm.

Based on IR spectra and comparison to oxygen free films, Li and Hsia speculated that the films have a structure similar to P3N5 which is a 6-numbered rings containing double bonds. The book on "Chemistry of Metals", published by CHAPMAN AND HALL and edited by Powell and Timms, discusses some new materials such as borazine, phosphazene etc, and also contain chemical and bonding information on these two materials. Borazine has a chemical structure B3N3H3 arranged in a planar ring structure as shown in FIG. 3B, and is liquid at room temperature. The ring itself has high innate stability and remains intact in many reactions. For example, hexamethyl borazine may be heated to 460° C. for 3 hours without any significant decomposition.

Figure 3A:
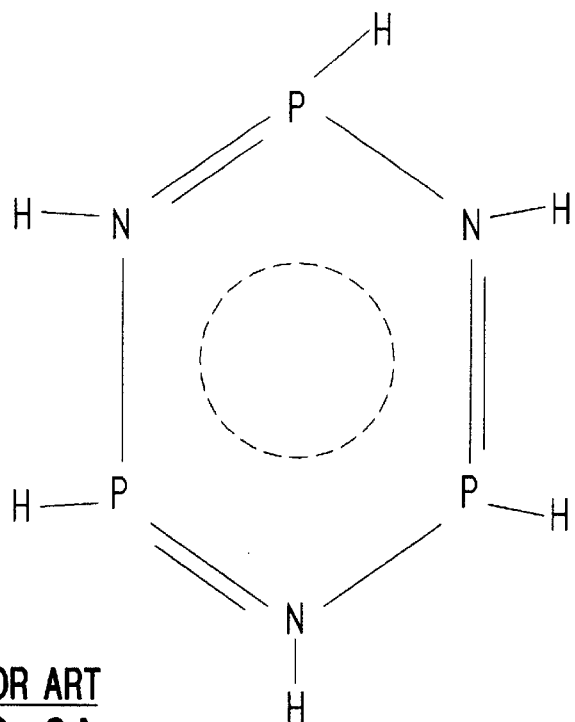
FIGS. 3A and 3B shows prior art molecular structure of phosphazene and borazine compounds.
Figure 3B:
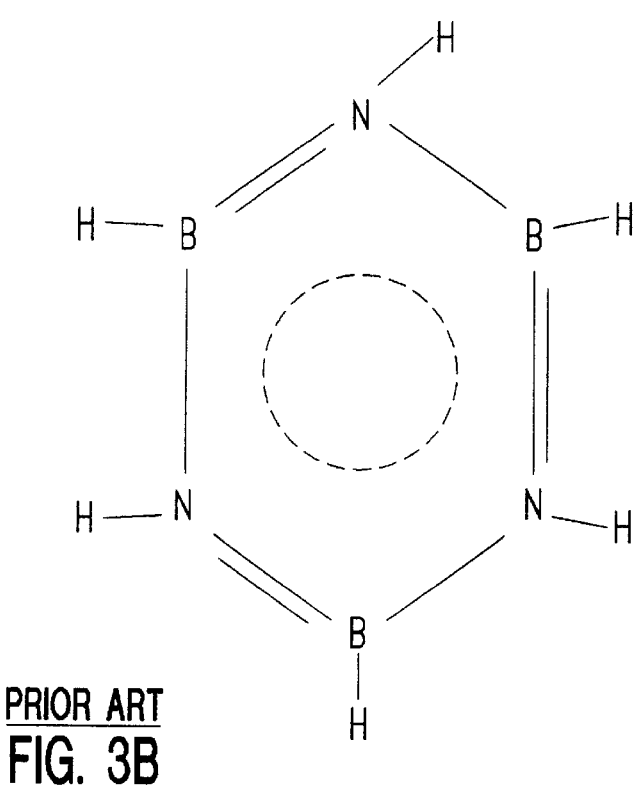

Phosphazene trimers tend to have a regular hexagonal planar ring structure somewhat similar to borazines, and is shown in FIG. 3A. Similar to borazines, wide range of substitutions can be made. For example, chlorophosphazenes tend to polymerize on heating to 300° C. and form long-chain rubbery polymers. Other substitutions for Cl is feasible. A nucleophilic displacement of chlorine by potassium fluorosulphite can lead to the fluorination of chlorophosphazene providing fluoro-phosphazene. Because of the wide range of polymers available, polyphosphazene has been claimed to be an attractive starting point for the synthesis of ceramic type materials (H. R. Allcock, M. F. Welker and M. Parvez, in MATERIALS, 1992 (4), p296–307). In a recent study, highly stable phosphazene with bonded fluorocarbon functional groups have been shown to be a good lubricant for disk storage applications. It should be noted that even though the trimers in FIG. 3 have been shown with H, they can also have OH group in place of H.

Figure 4:
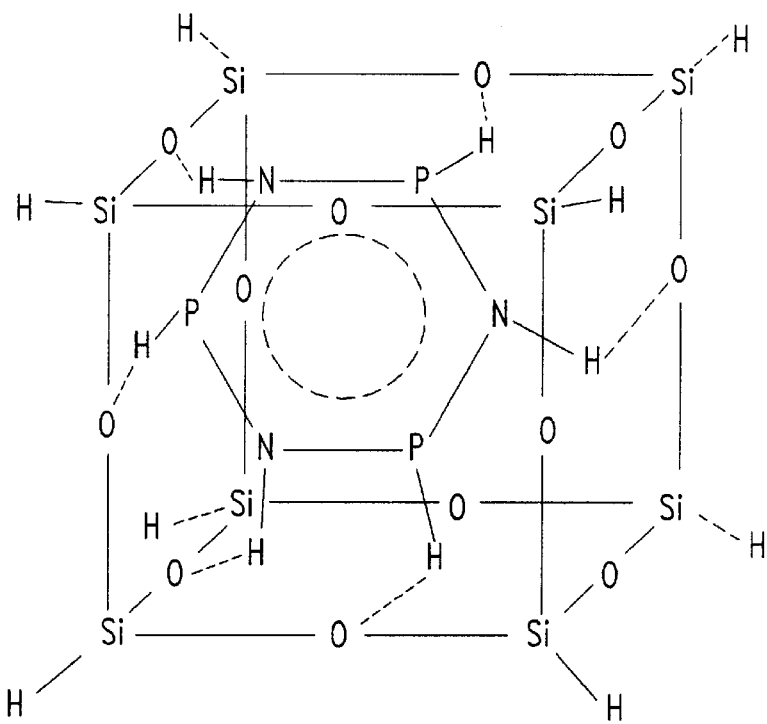
FIG. 4 shows a proposed molecular structure resulting from the reaction between flowable oxide and phosphazene.
Figure 5:
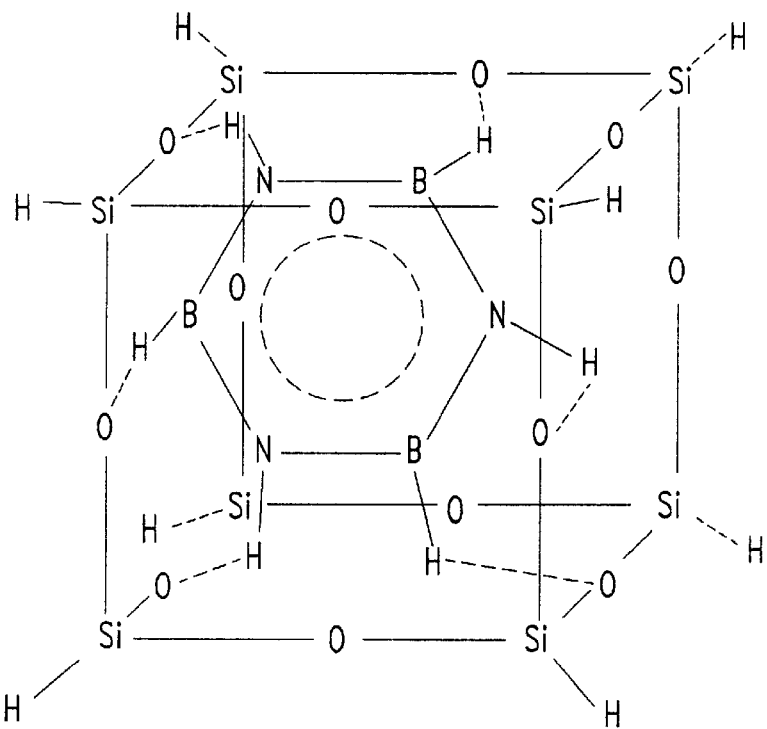
FIG. 5 shows a proposed molecular structure resulting from the reaction between flowable oxide and borazine.

The present invention has found that borazine and phosphazene can be advantageously reacted and combined with flowable oxide material to realize an improved B,P and N doped flowable material that can satisfy most of the requirements for the semiconductor applications discussed earlier. In specific, the invention teaches chemically mixing the phosphazene, fluorophosphazene and its derivatives and equivalents, and borazine and its equivalent or derivative materials, with the silsesquioxane in solution prior to casting, thereby promoting the chemical bonding between the highly reactive P or B containing trimer structure with the Si/or O molecule in the $SiO_2$ unit structure. FIGS. 4 and 5 show possible locations for the trimer within the $SiO_2$ unit cell. A close observation of the molecular structure shows that the trimer can locate within the unit cell in many orientations as there are many alternate O sites that the H or OH of the trimers can bond with. Irrespective of the exact location of the trimer or the exact bonding between the P or N or B with specific sites, good chemical mixing between the polar solvent borazine or phosphazene with Silsesquioxane solution is expected. On heating, the H and OH groups are expelled, resulting in a composition of silicon, phosphorus, nitrogen and oxygen, some what similar to nitrided Phospho-Silicate Glass (PSG). However, the present inventors believe that the trimer structure of phosphazene will be retained thereby providing stability against moisture even at high P level. As shown in FIG. 4, P=O—Si back bonding still exists similar to PSG and therefore the P from the phosphazene will be effective in reacting with and binding Na+ or other ionic species. Similarly, boron in the borazine will attach itself to the O—Si group as shown in FIG. 5. As discussed earlier, many other phosphazene compounds such as halide phosphazenes, fluorophosphazenes etc. can be used as a mixture with silsesquioxane so that in addition to B or P and N, one can add fluorine, chlorine or other elements to tailor the physical properties of the resulting insulator.

EXAMPLE 1

A 100 ml of silsesquioxane of 22 weight percent solution is taken, 1.18 grams of phosphazene is added at room temperature while stirring the solution. The mixture is spin coated over a substrate to obtain a thickness of 10 KÅ. The film is cured in nitrogen starting with a bake/cure cycle of 150° C. for 1 minite, 200° C. for 1 minute, 350° C. for 1 minute and 400° C. for 60 minutes. A cured hard insulating film is obtained containing 2 wt % of P and 0.9 wt % of N, the rest being primarily $SiO_2$. Most of the H and OH group is removed. For higher P amounts in the resulting film, the initial phosphazene added is accordingly increased. For example, for 10 wt % P in the resulting film, one would add about 7 grams of phosphazene to 100 ml of 22 weight percent solution silsesquioxane. For a given P or B wt % desired in the cured film, and given the concentration of the silsesquioxane, it is straight forward to figure out the amount of phosphazene or borazene needed.

EXAMPLE 2

Figure 6A:
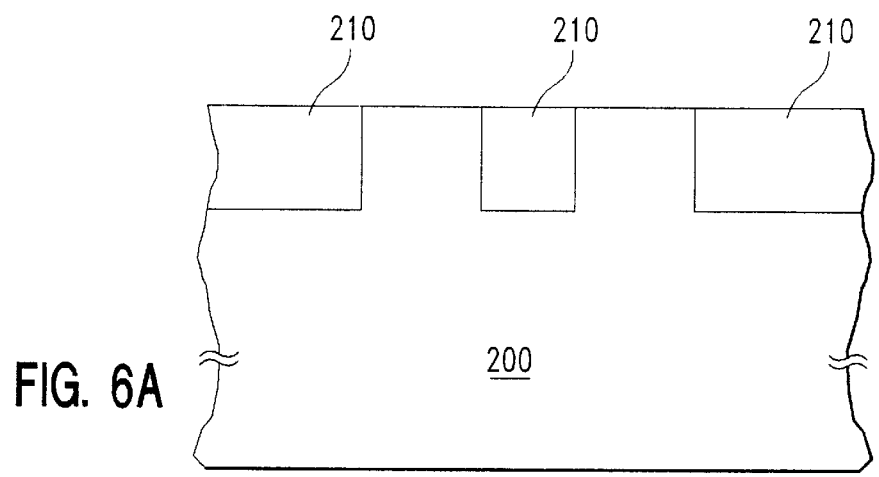
FIG. 6 shows forming of shallow trench isolation using the new material.
Figure 6B:
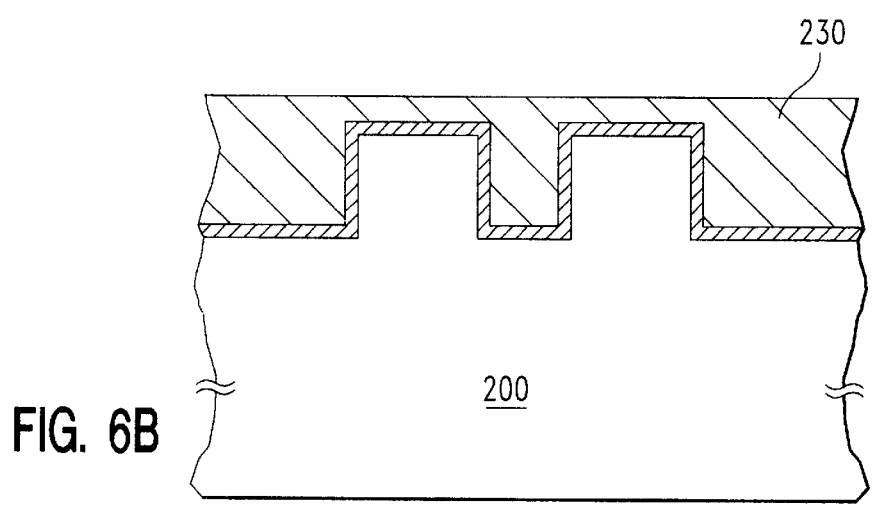
Figure 6C:
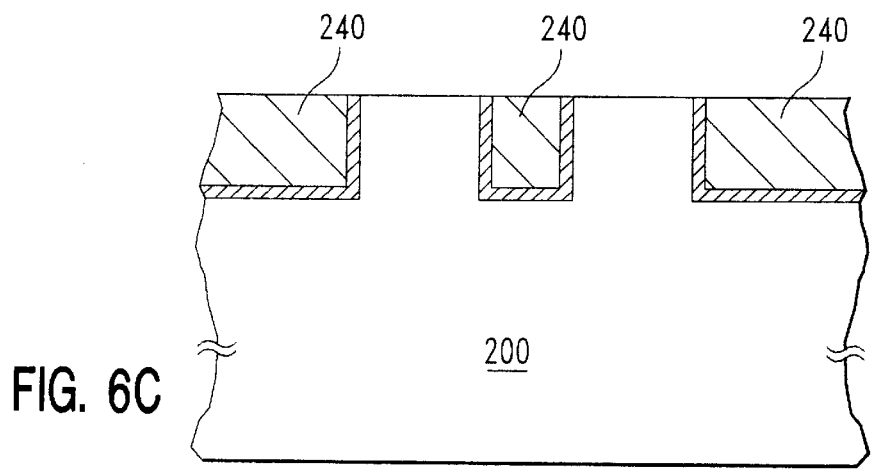

In this example, the insulating coating of example 1 is spin coated over a substrate containing trenches for isolation as shown in FIG. 6A–C. FIG. 6A shows a silicon substrate 200, where the desired trench or groove patterns 210 are etched using a mask (mask not shown). The mask can be a patterned resist by itself or in combination with a hard mask made of suitable insulating materials. If desired, a suitable coating 220 can be disposed on the surface of the trench as shown in FIG. 6B prior to applying the spin-on insulator. This could be a thermally formed silicon dioxide or deposited silicon dioxide or nitride conformally deposited. As shown in FIG. 6B, the material of example 1 is used for coating the substrate 200. The coating fills in the depressions and on heating forms a hard cured film 230 which fills the trenches and planarizes the substrate as shown in FIG. 6B. The material disposed on the substrate outside of the grooves can be removed by known etching or polishing processes (not described), thereby forming a high quality B,P,N doped silicon dioxide filled isolating trenches 240, as shown in FIG. 6C. Even though a specific application is discussed here, many other trench filling applications in semiconductor or other products using this improved material is feasible. Even though Si is discussed as a substrate, alternate substrates such as Alumnium oxide, glass ceramics, Aluminum nitride, plastic boards, graphite or diamond like carbon as a stand alone material or as a coating can be used in place of silicon. Any of these materials can have a surface coatings of organic or inorganic materials commonly used in different applications.

EXAMPLE 3

Figure 1:
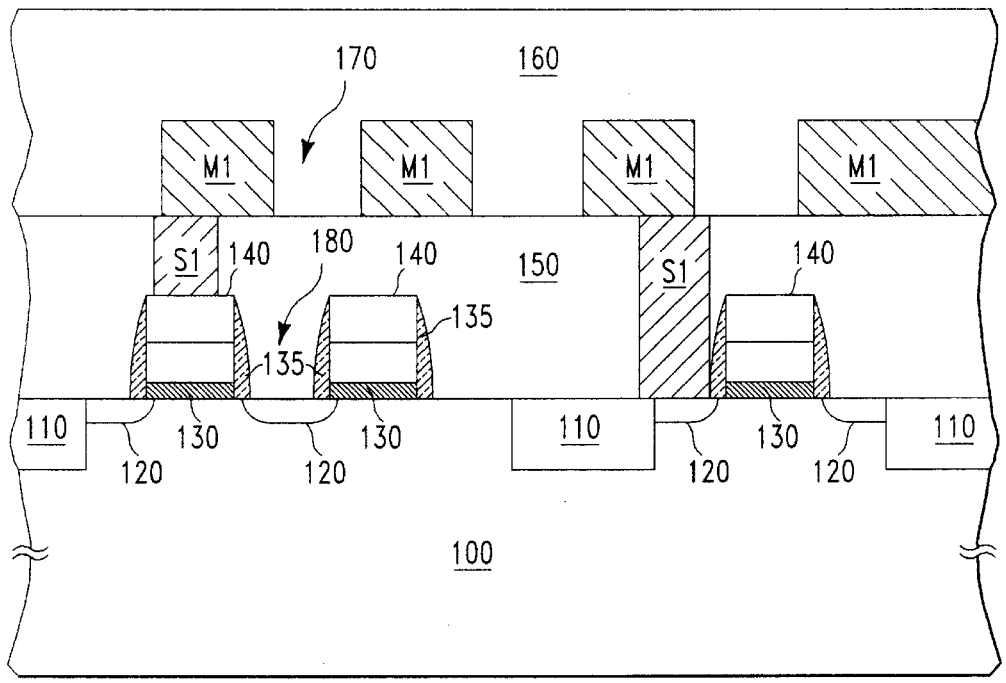
FIG. 1 shows a prior art cross section of an FET device, where a planarized insulator with barrier properties can be beneficially used.
Figure 7A:
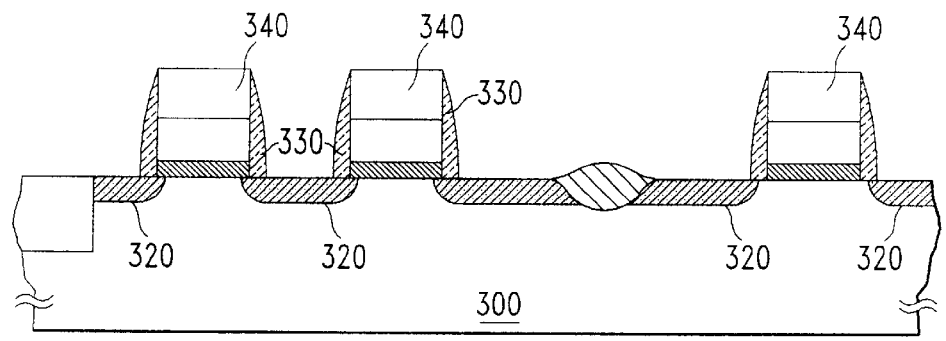
FIG. 7 shows series of steps for filling and planarizing a contact insulator structure.
Figure 7B:
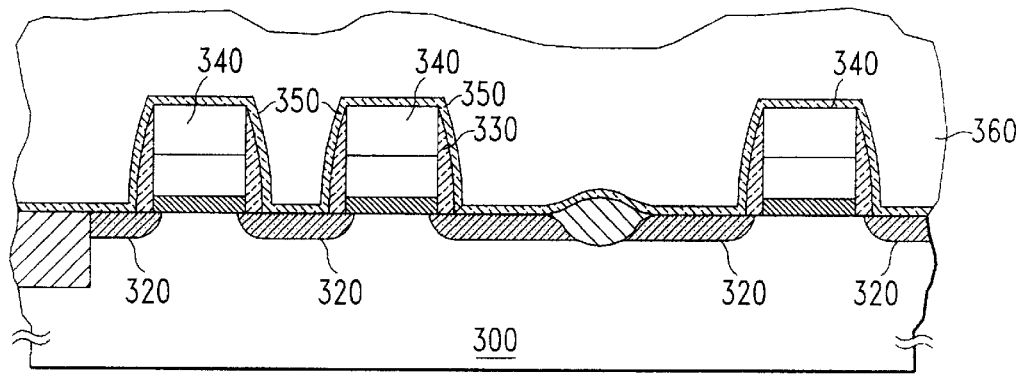
Figure 7C:
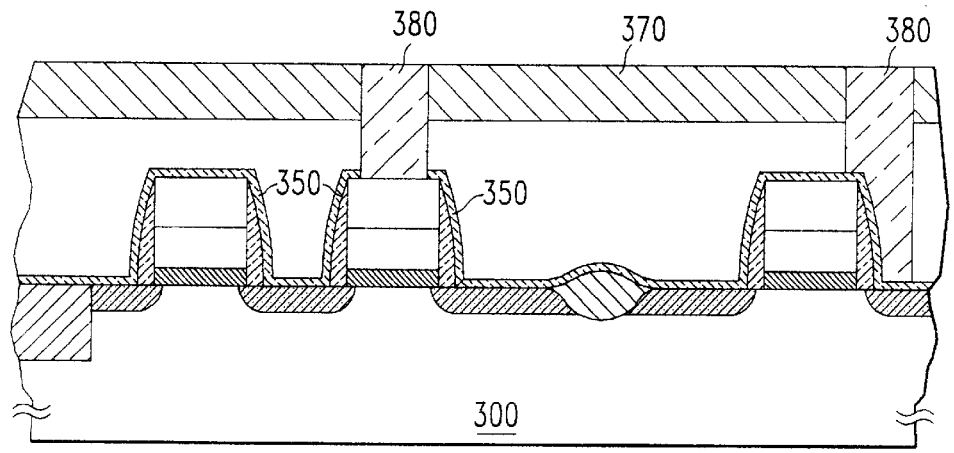

Another application of using the preferred insulator as a contact stud insulator is illustrated through FIGS. 7A–C. FIG. 7A shows an FET structure on a substrate 300, with two adjacently located gate electrodes 340 and diffusion regions 320 are shown. Sidewall spacers 330 are formed around the gate stacks. Now referring to FIG. 7B, a conformal insulating layer 350 is disposed on the substrate. By following the steps described in example 1, an insulation coating is formed and cured, resulting in film 360. If desired, a touch up polishing or other removal methods can be used to improve the planarity of the coating 360. If preferred another thin insulating layer 370 can be disposed over layer 360 prior to or after the optional planarization step. Thus, the substrate with the topography created by the trench etching or gate electrode or metal lines (as in FIG. 1, M1 lines with gap 170) with gaps can be filled and planarized by using the example 1 material. In one embodiment layer 370 is disposed on layer 360. Layer 370 can be $SiO_2$, SiN deposited preferably by a low temperature process. The interconnection of the devices, i.e wiring is now completed using known processes. For example, using a selective etch process, openings in the insulator are formed. If a conformal layer such as 350 is used, then the etching is stopped at the conformal layer. The conformal layer is subsequently removed using alternate etch condition depending on if the conformal layer is silicon dioxide, silicon nitride or other etch stop material such as boron nitride, aluminum oxide, diamond like carbon etc. Once the underlying electrical contact regions are exposed (such as diffusion, gate electrode), a conductive material is deposited in the opening thereby completing the electrical connection. A device with contact studs 380 is shown in FIG. 7C.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. An insulating coating formed on a substrate by a process comprising the steps of:

providing a solution of $(HSi(OH)_xO_{3-x/2})_n$;

modifying the solution by adding a selected amount of at least one material selected from a group consisting of phosphazene ($P_3N_3H_3$), fluorophosphazene, borazine ($B_3N_3H_3$) and mixtures thereof;

coating the solution on the substrate to form a layer; and curing said layer to form the insulating coating having primarily silicon, oxygen, nitrogen and at least one element selected from the group consisting of B,P and F.

2. The method of claim 1, wherein the insulating coating has a composition defined by silicon ranging from 0.5 to 0.66; oxygen ranging from 0.25 to 0.35, and nitrogen ranging from 0.005 to 0.05, the range of values being in atomic fractions.

3. The method of claim 2, wherein the insulating coating further contains P ranging from 2 to 10 weight percent.

4. The method of claim 2, wherein the insulating coating further contains B ranging from 2 to 10 weight percent.

5. The method of claim 2, wherein the insulating coating further contains P and B combined ranging from 2 to 10 weight percent.

6. The method of claim 1, wherein said solution of $(HSi(OH)_xO_{3-x/2})_n$ has solids content ranging from 8 to 22 weight percent.

7. The method of claim 1, wherein the substrate is selected from the group consisting of silicon, alumina, plastic, glass ceramic, carbon, graphite and diamond like carbon.

8. The method of claim 7, wherein the substrate has a coating of polyimides, silicon dioxide, silicon nitride, aluminum oxide and diamond like carbon.

9. The method of claim 1, wherein step of curing consists of heating the substrate with coating stepwise from 150° C. to 450° C.

10. The method of claim 1, wherein the substrate has a topography created by etching a patterned recess.

11. The method of claim 1, wherein the substrate has a topography created by patterned projecting features.

12. The method of claim 11, wherein the projecting features are field effect transistor gate stacks.

13. The method of claim 11, wherein the projecting features are conductors formed on the substrate.

* * * * *